United States Patent [19]

McCaldin et al.

[11] Patent Number: 4,479,847

[45] Date of Patent: Oct. 30, 1984

[54] EQUILIBRIUM CRYSTAL GROWTH FROM SUBSTRATE CONFINED LIQUID

[75] Inventors: James O. McCaldin, Pasadena, Calif.; Thomas F. Kuech, Ossining, N.Y.

[73] Assignee: California Institute of Technology, Pasadena, Calif.

[21] Appl. No.: 335,889

[22] Filed: Dec. 30, 1981

[51] Int. Cl.$^3$ .............................................. C30B 19/12
[52] U.S. Cl. .................................................. 156/624
[58] Field of Search .................... 156/624; 427/86, 93; 148/171

[56] References Cited

U.S. PATENT DOCUMENTS 4,251,299  2/1981  Baliga ................................. 156/624

FOREIGN PATENT DOCUMENTS 4934269  9/1974  Japan .................................. 656/624

OTHER PUBLICATIONS

McCaldin, James O., et al. Stability and Pinning Points in Substrate-Confined Liquids, J. Appl. Phys. 52(2), Feb. 1981, pp. 803–807.

Kuech, T. F., Confining Substrate for Micron-Thick Liquid Films, Appl. Phys. Lett. 37(1), Jul. 1, 1980, pp. 44–46.

Lam, H. W., et al., Characteristics of Mosfets Fabricated in Laser-Recrystallized Polysilicon Islands with a Retaining Wall Structure on an Insulating Substrate, IEEE Electron Device Letters, vol. EDL-1, No. 10, Oct., 1980, pp. 206–208.

Geis, M. W., et al., Silicon Graphoepitaxy Using a Strip-Heater Oven, Appl. Phys. Lett. 37(5), Sep. 1, 1980, pp. 454–456.

Kylkov, V. I., Diataxial Growth of Silicon and Germanium, Journal of Crystal Growth 52(1981), pp. 687–691.

*Primary Examiner*—Hiram H. Bernstein
*Attorney, Agent, or Firm*—Freilich, Hornbaker, Rosen & Fernandez

[57] ABSTRACT

A method for in situ growth of an array of single crystals from material deposited on an inert substrate is comprised of (1.0) preparing a surface of the substrate with a closely packed array of concavities which stably contain liquid material by the combined effects of surface tension and geometry, (2.0) depositing the material from which the crystals are to be grown on the prepared surface of the substrate to at least partially fill the concavities, (3.0) removing deposited material from the field by evaporation etching after the next step, and (4.0) crystallizing the material remaining in each concavity. The process may be followed by a further step (5.0) of recrystallizing the material to assure a single crystal in each concavity free of any defects, such as defects resulting from etching. Crystallization may be effected by isothermally heating the substrate at a liquid temperature of the deposited material and changing the composition of the deposited material, and deposited material may be removed from the field during the process of crystallizing the material. The concavities are preferably provided as densely packed polygons plasma etched with vertical walls.

12 Claims, 12 Drawing Figures

EQUILIBRIUM CRYSTAL GROWTH FROM SUBSTRATE CONFINED LIQUID

ORIGIN OF THE INVENTION

The Government has rights in this invention pursuant to Contract No. MDA 903-81-C-0354 awarded by the Department of Army.

BACKGROUND OF THE INVENTION

This invention relates to in situ single crystal growth on an inert substrate, and more particularly to growth of an array of semiconductor crystals.

There is considerable interest currently in in situ single crystal growth, i.e., growth at the site of ultimate use, most notably with Si, and in the integrated circuit context. One epitaxial growth system, silicon on sapphire (SOS), has competed directly with mainline Si technology, and other laser-utilizing growth schemes could supplement the mainline technology, as prototypes have demonstrated. Yet other possibilities for in situ single crystal growth exist, however, in perhaps less demanding contexts, e.g., in discrete devices like detectors or in photovoltaic devices.

Many schemes for in situ growth have the substrate play a direct role in nucleating crystal growth, e.g., in SOS and graphoepitaxy. Another approach, however, is to use the substrate in a more traditional role as a means to contain a liquid growth medium. In the context of the present invention, this approach could be called a "two-dimensional Bridgman."

Instances of the substrate mainly providing mechanical support for a thin film of liquid material were recently discussed by T. F. Kuech and J. O. McCaldin ("Confining substrate for micron-thick liquid films," Appl. Phys. Lett. 37, 44, July 1, 1980) who demonstrated how suitable contours in the surface of a substrate enable it to hold a thin liquid film captive on its surface. The liquid film is so confined due to an interplay between geometry and surface tensions. Although not much discussed in that paper, a striking feature of those experiments was the relative inertness of an SiO$_2$ substrate toward nucleating crystal growth. Thus in "two-dimensional Bridgman" growth, one can have the opposite of the situation in graphoepitaxy where the substrate is active in nucleating crystallization.

The efficacy of variously shaped depressions in confining liquid stably, however, varies widely, as more recently discussed by the same authors ("Stability and pinning points in substrate confined liquids" J. Appl. Phys. 52, 803, February, 1981). The problem of obtaining liquid confinement in a substrate surface is twofold: first, the liquid must be put into some desired configuration and, secondly, this configuration must be stable, at least against small perturbations.

Most in situ crystal growth methods currently practiced of necessity employ lasers, electron beams, moving graphite heater strips, or similar dynamic heating means. Such dynamic heating means make control of the crystal growth process more difficult than is the case in conventional crystal growth processes, such as the Czochralski and Bridgman methods. To the contrary, the near-equilibrium growth methods proposed in this application utilize temperatures that are either uniform or very close thereto, so that our methods enjoy the same ease of control as the conventional crystal growth methods.

There are various technologies for the deposition of films and coatings. These are physical vapor deposition (PVD) consisting of evaporation, sputtering, ion plating; chemical vapor deposition (CVD) and plasma-assisted chemical vapor deposition (PACVD), electrodeposition and electroless plating; thermal spraying; plasma spraying; and detonation gun technologies.

The crystals of primary interest for growth by the present invention are the semiconductors. Applications where in situ crystal growth of these materials would be useful are manifold, most notably in arrays of devices like detectors, solar cells, and possibly integrated circuits. The characteristic dimension in most of these devices is a few microns, and an extensive lithographic art is now available to fashion structures to such dimensions. The present invention is primarily intended for structures of such size. However, the applicable techniques would permit a wide range of sizes which can equally well benefit from the present invention.

In undertaking the task of growing semiconductor thin-film crystals, it is necessary first to determine what substrate materials are most appropriate. Many materials have been considered in the solar cell art: Mo, W, Kovar (an iron-nickel-cobalt alloy), various glasses, to name a few. For the present invention, materials that interact little with the liquid are to be preferred. Amorphous SiO$_2$ is such a material, though Si$_3$N$_4$ may interact negligibly in some cases. Sintered graphite, ceramic and cermet are other examples. The implication for the present invention is that useful contact angles $\theta$ between liquid and substrate are likely to be large, most probably in the range $90° < \theta \lesssim 150°$, which is approaching what is often called "nonwetting". The problem is then to confine liquid material on the surface of the substrate while crystals are grown from the material using a selected one of the various technologies available.

OBJECTS AND SUMMARY OF THE INVENTION

An object of this invention is to provide an array of concavities in an inert substrate that will confine liquid material in a desired stable configuration.

Another object is to provide a method for in situ growth of an array of single crystals on an inert substrate from a liquid material.

These and other objects of this invention are achieved by preparing a surface of an inert (non-nucleating) substrate with an array of concavities that will stably contain liquid material by the combined effects of surface tension and geometry. The concavities may be formed using conventional photolithographic etching techniques, relying more on plasma etching rather than a wet chemical etching in order to provide near vertical walls.

The liquid material from which crystals are to be grown is deposited on the prepared surface of the substrate to at least partially fill the concavities. If the material is deposited as a liquid, it may be crystallized by cooling it below its melting temperature, or alternatively by changing the composition of the liquid material by either adding or subtracting a component. In the case of adding, the concavities are only partially filled at least initially, and in the case of subtracting, the concavities are initially overfilled. Liquid material deposited on the field is then cleared, possibly by wet etching but preferably by evaporation or gaseous chemical reactions, either during crystallization, as in the case of subtracting a component, or before crystallization. The crystallized material in the concavities may then be recrystallized by heating the material in the concavities above melting temperature and slowly cooling to assure a single crystal in each concavity. If the material is deposited as a solid film, it will tend to be uniform over the field and in the concavities, but some material in the field may be caused to flow into the concavities, as by cold flowing with pressure against a flat plate or by surface melting with a scanning laser, and then the remaining material on the field is removed, such as by etching. Alternatively, the solid film may be heated above the melting point and then cooled before depositing more film. This procedure is repeated to at least partially fill the concavities. Then the field is cleared by etching. The material remaining in the concavities is melted and allowed to cool slowly for single crystal growth in each concavity, or allowed to grow a compound crystal as in the case of depositing a liquid material.

DESCRIPTION OF PREFERRED EMBODIMENTS

Figure 1:
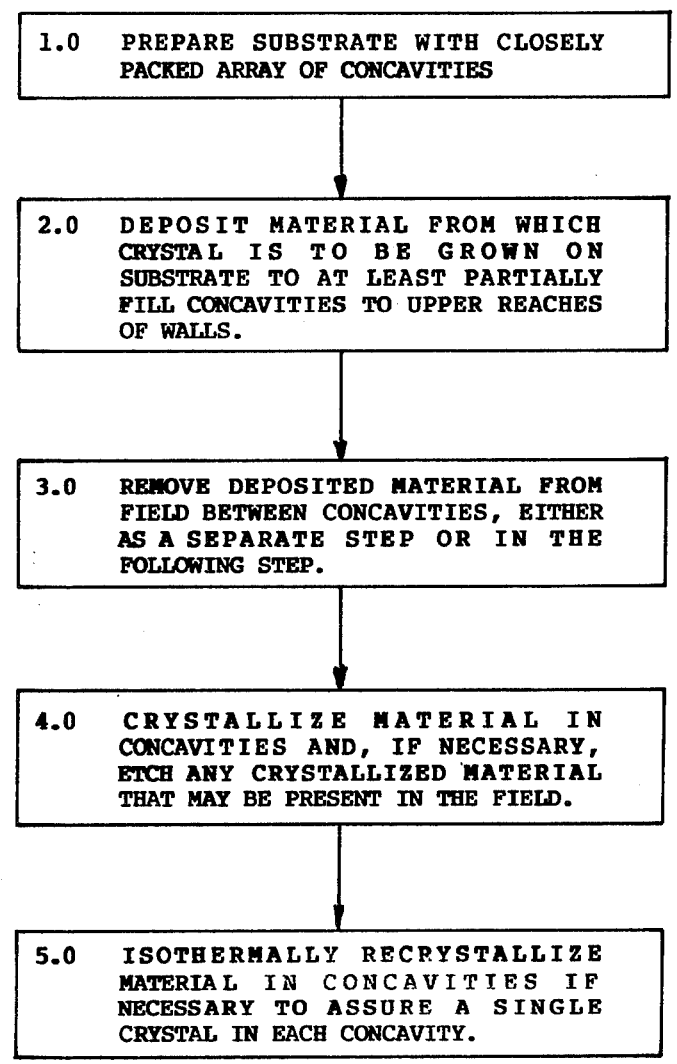
FIG. 1 is a general flow chart of the process for the present invention.

Referring to the drawings, FIG. 1 illustrates in a flow chart the method for in situ growth of an array of single crystals on an inert substrate in accordance with the present invention. The first step indicated generally by a block 1.0 is to prepare a substrate with an array of concavities to stably contain liquid material from which a single crystal is to be grown in each concavity. The next step indicated by a block 2.0 in the flow chart is to deposit material on the substrate to at least partially fill the concavities. This step is indicated in brief, and therefore general terms, because of the many different basic deposition technologies from which one may be selected to practice the invention. The substrate is isothermally heated at or above the melting temperature only in the cases of starting with a liquid material deposited on the substrate.

The next step indicated by a separate block 3.0 is to remove deposited material from the field, i.e., the areas between concavities. That operation may be carried out concurrently with the process used in the next step for causing crystallization of deposited material, such as when the technique for crystallization chosen is one which removes a component of liquid material in the concavities, since that also also can remove deposited material on the field. Otherwise removal of material from the field is done in a separate step, such as by evaporation. It should be noted that the liquid material in the field will form separate globules except where they may come in contact with globules of material in the concavities.

The forces of surface tension can cause the remaining material in the field globules to be drawn into the concavities wherever there is contact between the small globules on the field with the greater globules in the concavities. However, there can be disadvantages to this process. Statistically there will be variations in the number of field globules contacting the different concavity globules, so that some concavity globules will grow more than other concavity globules by this accretion process. Also it occasionally happens that a larger field globule can contact two concavity globules at the same time, thereby forming one oversize globule spanning two concavities. To counter these adverse possibilities one can resort to a technique analogous to one well known in crystal growth. One goes through a series of deposition-followed-by-evaporation steps such that there is a net long term deposition of large globules in the concavities, but during the short evaporation steps the smaller globules are removed.

In the case of depositing solid material, a series of deposition-followed-by-melting steps are carried out such that at each step there will be deposition of material in the concavities and the field, and during the melting, some of the material in the field will flow into the concavities. Following the last step, the material remaining in the field is removed by etching.

The step 3.0 of clearing the field is a separate one in the case of depositing separate material, as just noted, and also when the technique chosen for crystallization does not remove liquid material, as when an additive solution growth method is used, or when the liquid material is simply cooled to below its melting temperature. In any case, unwanted crystallized material present in the field may be removed by etching after crystallization.

Recrystallization is indicated as the final step in block 5.0. This is done by heating the crystallized material in the concavities to a temperature above its melting point, and then slowly cooling the material. This assures a single crystal in each concavity and repairs any damage that may have been done by etching.

In the case of deposited material in the solid state, the field may be cleared by causing it to cold flow into the concavities, such as by pressure against a flat plate, and then etching the material that remains in the field. Then the substrate is placed in a furnace tube in a hydrogen atmosphere to melt the material and reduce any oxides of the material. Now with the material in the liquid phase, crystallization may be carried out by cooling or a conventional solution growth method.

Examples of these techniques indicated generally by block 2.0, 3.0, 4.0 and 5.0 will be set forth hereinafter in specific examples, although such techniques are conventional and well known in other contexts. The gist of the problem of this invention outlined in FIG. 1 is confining the liquid material in some desired configuration that is stable for crystallization. Consequently, techniques to stably confine liquid material in an array of concavities will first be discussed.

Substrates can be prepared in various ways, for example, machining. In one case, a high density graphite substrate is machined without lubricant and under a canopy to avoid pickup of dust. It would also be possible to produce a mold with micrometer sized projections using lithographic techniques, and to use the mold to repeatedly form substrates with arrays of concavities using either sintering processes, as with graphite, ceramic or cermet, or conventional casting processes.

An example of the lithographic technique is with a substrate of silicon using a single mask with an array of openings of the desired geometry of about 10 $\mu$m in diameter on 12.5 $\mu$m centers. Plasma etching is preferred over chemical etching in order to obtain near vertical walls. (When chemically etching the substrate, the concavities enlarge laterally as well as vertically so that the side walls become curved segments with a generally flat region in the center.) After etching, the entire substrate may then be covered with a thermal oxide. Incidentally, it may be desirable to limit the thickness of the thermal oxide to about 5 nm in order to allow electrical conduction, though in some processing techniques, oxide layers of as much as 70 nm have been found to allow electrical conduction through the layer. This electrical conduction then permits a "back contact" for the devices, such as photodetectors and solar cells, made using the single crystals grown in the concavities. In the case of other types of materials for the substrate, such as ceramic, cermet or graphite, a more direct way of providing the "back contact" may be to prepare the substrate material itself to be conductive.

Figure 2:
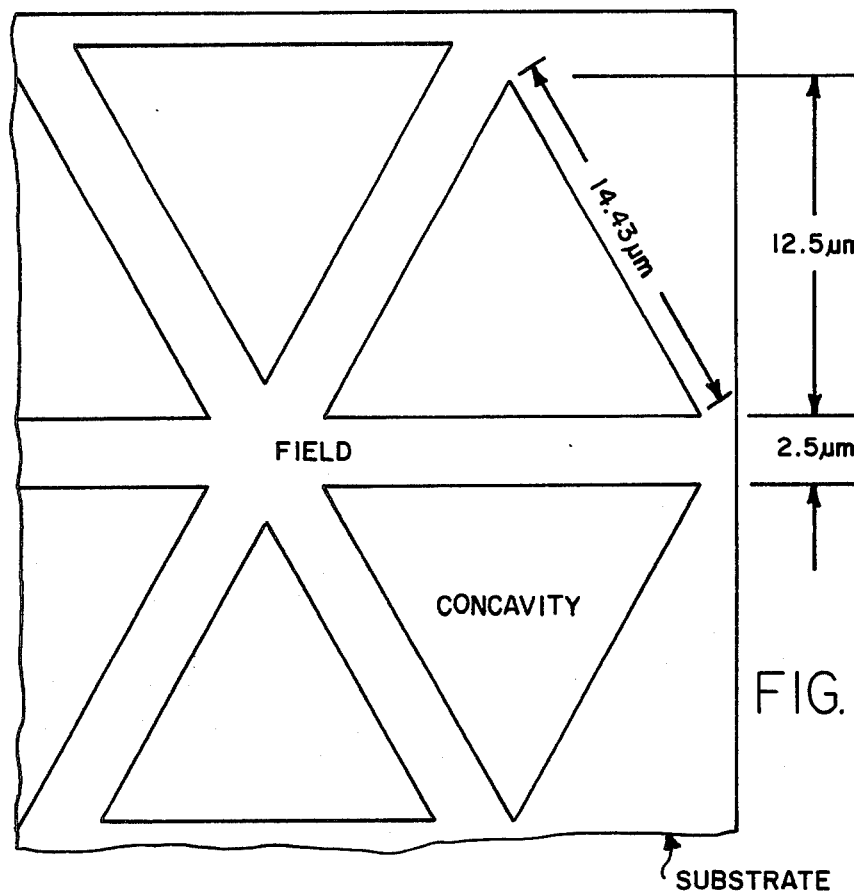
FIG. 2 illustrates schematically in a plan view one geometric configuration for concavities in a substrate for this process using equilateral triangles.
Figure 3:
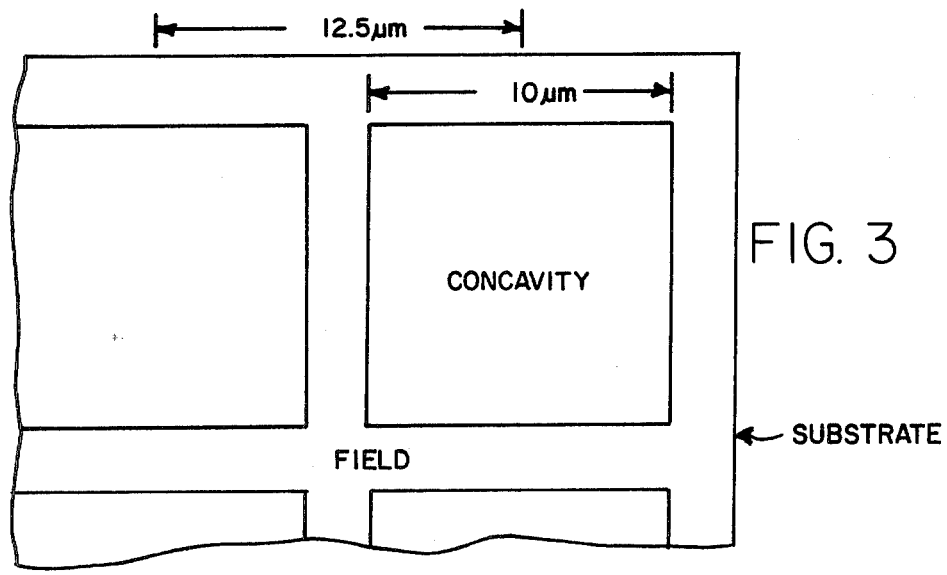
FIG. 3 illustrates schematically in a plan view a second geometric configuration for concavities using squares.
Figure 4:
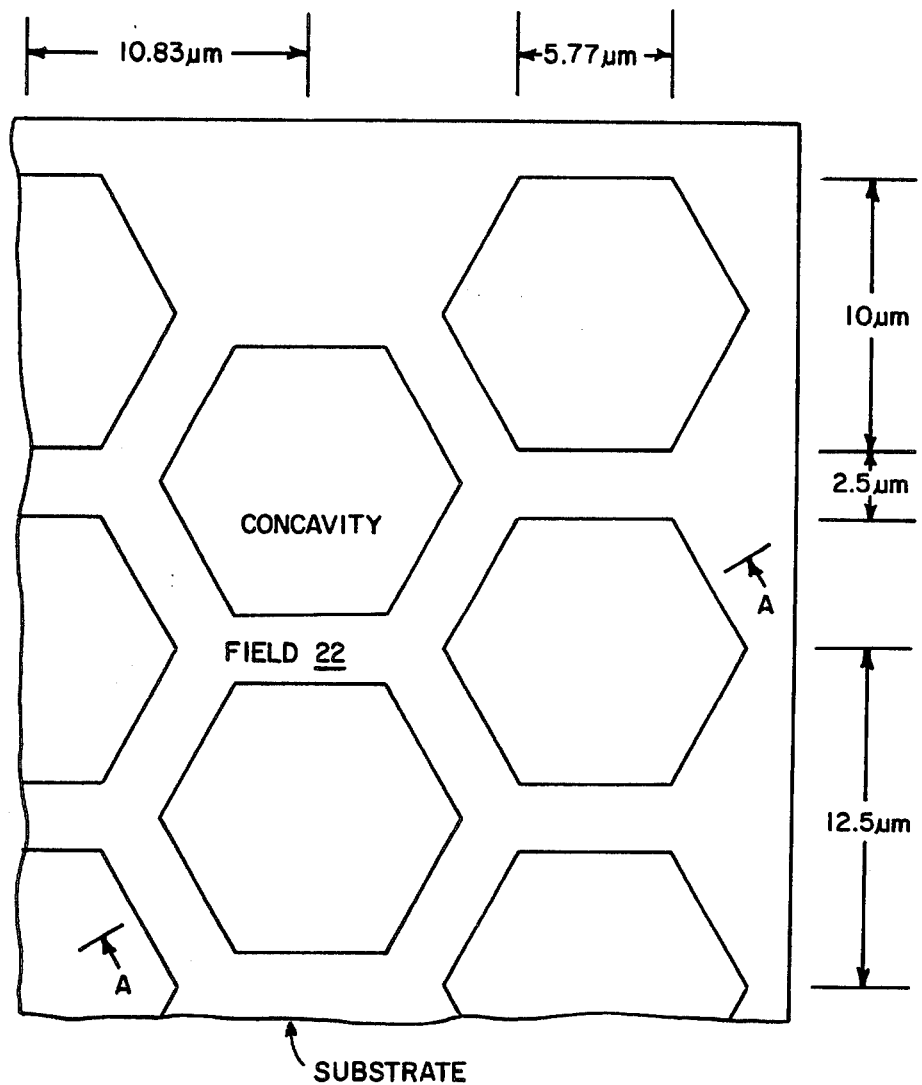
FIG. 4 illustrates schematically in a plan view a third geometric configuration for concavities using regular hexagons.

Although many geometric configurations are possible, including polygonal, circular and oval, the preference for dense packing with a minimum of field between concavities makes a polygon selected from a group consisting of triangles, parallelograms, and hexagons the optimum, as these geometric configurations will allow the concavities in the surface of a substrate to be densely packed, as shown in FIGS. 2, 3 and 4, respectively, for the special cases of equilateral triangles, regular hexagons and squares. Typically, the equilateral triangles are spaced 2.5 $\mu$m apart with 14.43 $\mu$m sides. The squares and regular hexagons may be comparable in size (10 $\mu$m on 12.5 $\mu$m centers) as shown in FIGS. 3 and 4.

The regular hexagon has sixfold symmetry, whereas the equilateral triangles and squares have threefold and fourfold symmetry, respectively. Since it may be desirable to control the orientation of all the single crystals grown in the concavities to be in the same direction, a geometry having a threefold or fourfold symmetry would be preferred over sixfold to minimize the problem of orientation control by limiting the possibilities of orientation in the first instance. This would suggest using the triangular or square concavity configuration. However, hexagonal concavities have substantial advantages: they pack densely, and if all included angles are 120°, each concavity will fill fully during deposition because of the larger (120°) included angle between adjacent sides.

Figure 5:
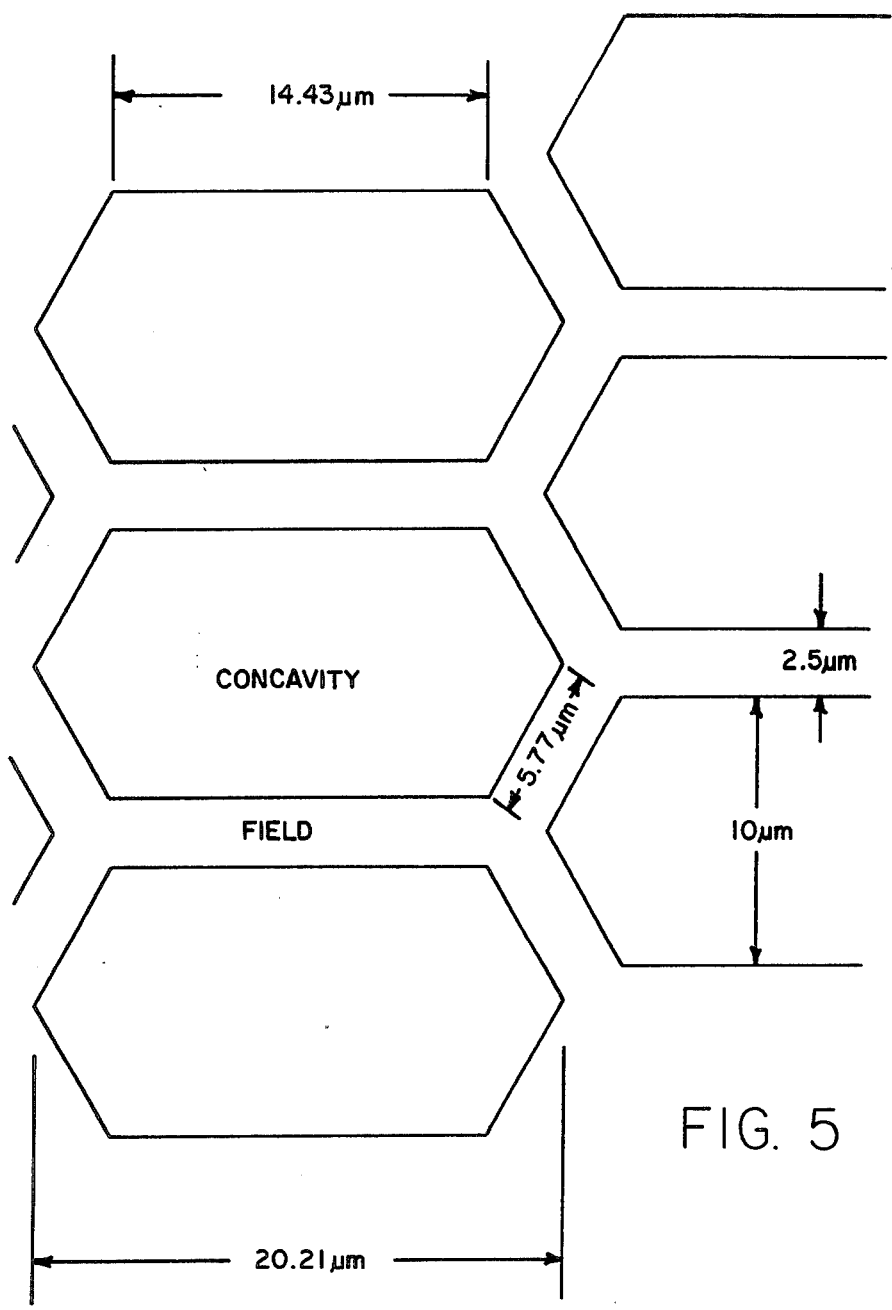
FIG. 5 illustrates schematically a variant of the geometric configuration of FIG. 4 which approaches a rectangular configuration for the concavities.
Figure 6:
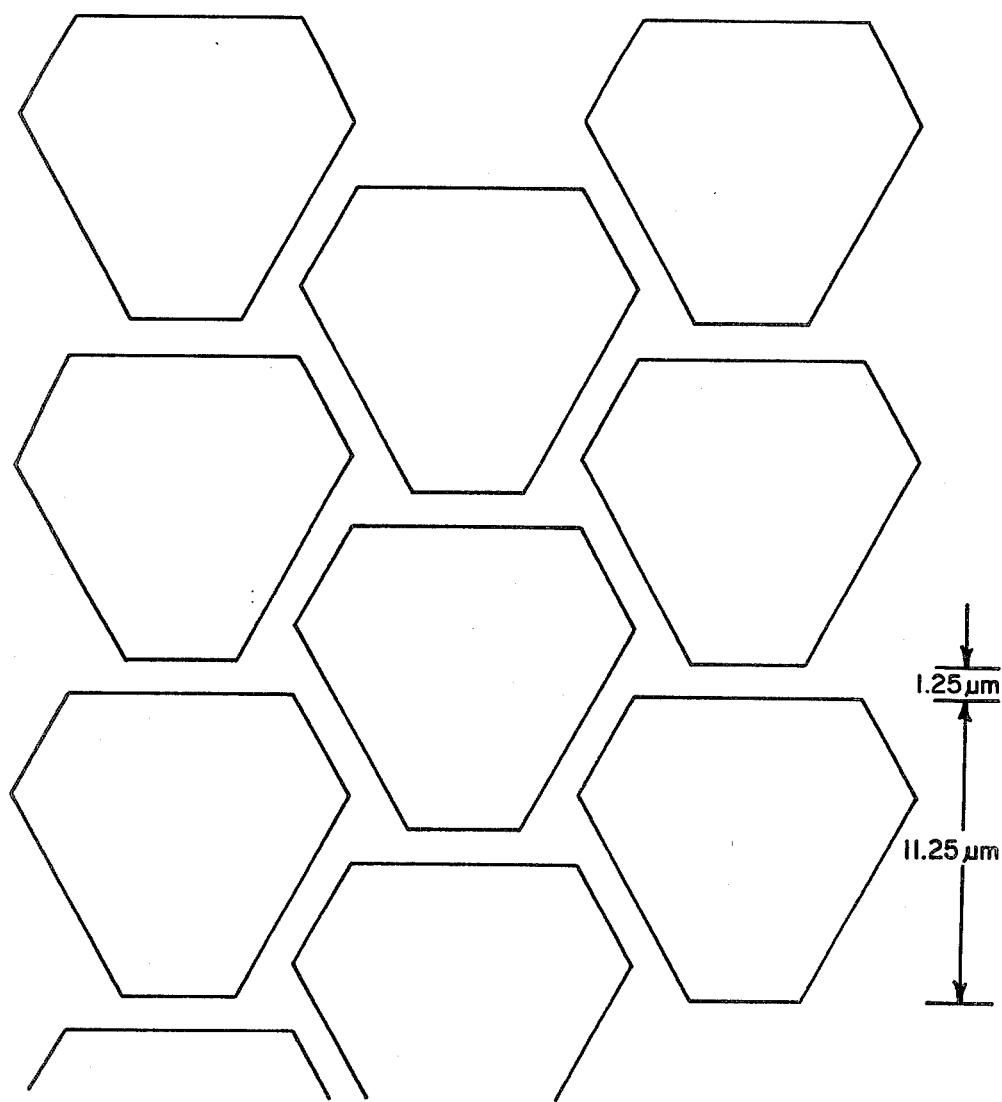
FIG. 6 illustrates schematically a variant of the geometric configuration of FIG. 4 which approaches a triangular configuration for the concavities.

To give the hexagon the desired symmetry, for example twofold or threefold, one need only perturb this hexagon slightly. For example, two opposite sides may be made uniformly longer, as shown in FIG. 5 for twofold symmetry, or alternate sides may be made uniformly longer than the remaining sides of uniform length as shown in FIG. 6 for threefold symmetry. Note that the case illustrated in FIG. 5 approaches a rectangle, and the case illustrated in FIG. 6 aproaches a triangle. The latter will thus have the advantage of a triangle without having small (60°) included angles, only large (120°) included angles.

Figures 7, 8:
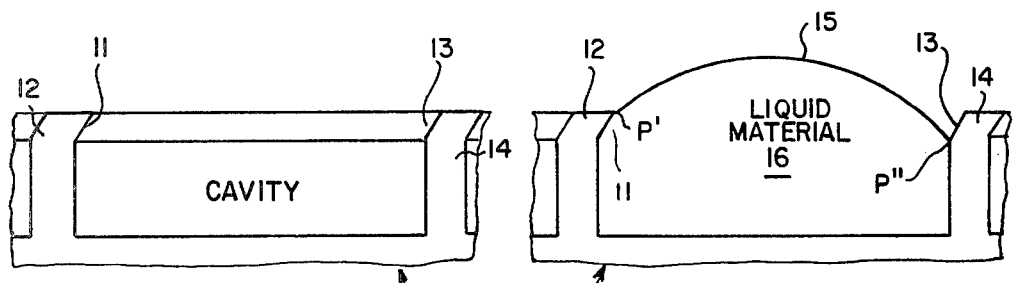
FIG. 7 shows schematically a vertical cross section through a concavity, such as a hexagon, which has its opposing side walls perturbed to reduce the 2n-fold symmetry of the concavity to n-fold symmetry.
FIG. 8 shows schematically the distorted meniscus of liquid in the concavity of FIG. 7.

For any configuration, a 2n-fold symmetry can also be reduced to n-fold symmetry by distorting the opposing side walls, as shown schematically in a vertical cross section in FIG. 7, where the upper reaches 11 of one wall 12 is caused to overhang a cavity and the upper reaches 13 of the opposing wall 14 is inclined out. This distortion of the upper reaches 11 and 13 of the opposing side walls 12 and 14 will cause the meniscus 15 of liquid 16 filling the concavity in a substrate to be distorted, as shown in FIG. 8, thus reducing the 2n-fold symmetry from six to three in the case of a regular hexagon. This type of distortion may be achieved by anisotropic etching of a silicon (111) substrate. The results produced are an overhang and an incline on opposing sides at 28° from the vertical walls.

Figure 9:
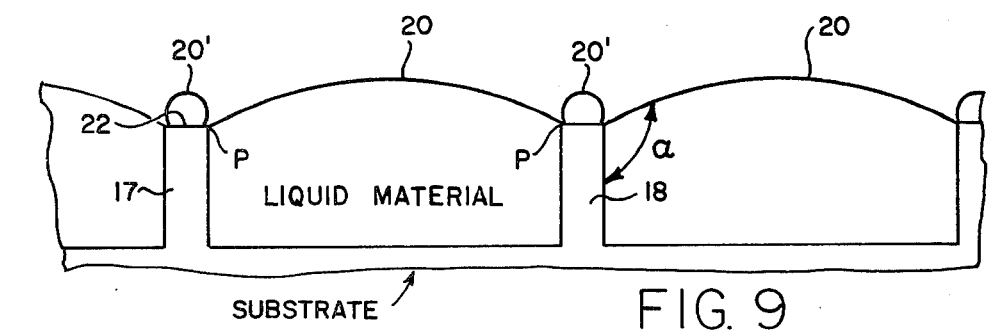
FIG. 9 is a cross section taken on a line A—A in FIG. 4.

For simplicity of discussion, we assume hereinafter a regular hexagonal concavity configuration in a substrate with vertical side walls, as shown in a cross section in FIG. 9 taken on a line A—A in FIG. 4. As noted hereinbefore, the vertical side walls may be produced by plasma etching.

Confinement of micron-thick films of liquid in concavities of a substrate is discussed by the inventors hereof in their paper "Stability and pinning points in substrate liquids," supra. That paper analyzes in detail hemispherical concavities, and hemispherical concavities having a central flat region, as might result from chemical etching. It illustrates an example of a plasma etched concavity and states that "Though hemispherical depressions afford stability . . . , they do not necessarily afford an optimum shape for crystal growth . . . . Some modification of the hemispherical depression toward (a large flat bottom) does not change the meniscus too much." Vertical side walls 17 and 18 as shown in FIG. 9 tend to stabilize the meniscus.

Once the substrate has been prepared with an array of densely packed concavities, material 20 is deposited in the concavities. This material can be deposited as a liquid by heating the substrate at or above the melting temperature of the material. In either case, enough material is deposited to at least partially fill the concavities to the upper reaches of the side walls, as illustrated in FIGS. 8 and 9 for the special case of filling with liquid material to the pinning points which are, in the case of FIG. 9, the corners P of the side walls with the surface and, in the case of FIG. 8, the protruding points P' and P" of the side walls. Since the pinning point P" on the right is lower than the pinning point P' on the left, in the case of FIG. 8, the meniscus is lower on the right. It is this feature that will cause the perturbed regular hexagon to have threefold instead of sixfold symmetry.

Continuing the discussion with the more general case of depositing liquid material 20 on the concavities, some liquid material 20' will also be deposited on the field 22 (surface area) between concavities. The field 22 as shown more clearly in FIG. 4 is the area between hexagonal concavities. The liquid material 20' forms globules on the field while the deposited material 20 in the cavities forms large globules spanning the width of the concavities.

While the material is being deposited, a flux of material arrives at the surface and agglomerates into globules which grow until they touch and coalesce into larger globules. The agglomeration in the concavity is similar to that in the field except that once the globules approach the concavity in size, they are forced to coalesce until eventually only one globule can fit into a concavity. During this filling and coalescence process, there is no instability for an isolated concavity, which eventually fills to its pinning points when the proper amount of material is deposited regardless of the history of the filling process. To continue to deposit material would overfill the concavity, if desired. As long as the apparent contact angle α (FIG. 9) does not become so large that liquid contained in a concavity can move laterally across the field, the rim of the wall of the concavity becomes a boundary for the liquid, i.e., the rim corners pin the edge of the meniscus, hence the term pinning points. Continued addition of liquid pushes the meniscus upward and the apparent contact angle α increases exceeding the contact angle θ of the material, which is a characteristic of the material on the particular type of substrate, and eventually exceeding 180°. To continue to overfill significantly beyond that point causes the material to wet the surface and spread from the concavity over the field. Note that the globules in the field also grow and can merge with material contained in the concavities.

The effect of the sides of the rim acting as pinning points may be somewhat enhanced by the addition of an overhang of the field around the entire rim of the concavity. Also an overhang can help keep separate the liquid on the field from that in the concavities.

To clear the field, the liquid material is heated to a high temperature for evaporation, for example with a hydrogen gas passing over it. This, of course, also removes material from the concavities, so it is desirable to overfill the concavities in the first instance. The field may be further, or alternatively, cleared by etching after crystallization of the deposited material. The field may also be cleared while crystallization is taking place in the case of a subtractive solution growth method for crystallization.

It should be noted that no matter how densely one packs the concavities on the substrate surface, some field must remain between concavities. When material is deposited onto the substrate, as solid or liquid, some deposit accumulates on the field. The methods found most generally useful for clearing the field, namely evaporation and etching, takes advantage of the disparity in size of deposits on the field as compared to the deposits in the concavities. The deposits on the field are usually much the smaller and thus are consumed in the clearing process, e.g., etching or evaporation, long before the materials in the concavities.

Figures 10, 11:
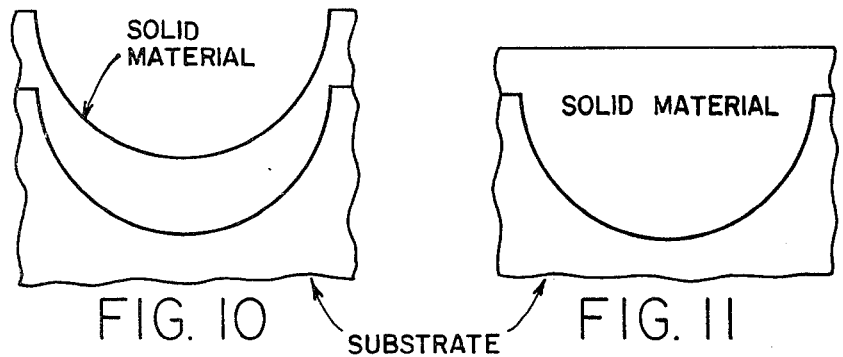
FIG. 10 is a cross section of a concavity partially filled by solid deposition of material.
FIG. 11 illustrates the cross section of FIG. 10 with the concavity more nearly filled by either a cold flow process under pressure from a flat plate, or melting and cooling solid material deposited in successive steps.

When the material M is deposited as a solid, the material will, in general, produce a continuous thin film, bridging concavities and field as shown in FIG. 10, a situated called "step coverage" in the integrated circuit technology. If the film were completely melted, many concavities, in fact in many situations, most would lose liquid material to the field. However, it is possible to first level the surface portion of the deposited film by melting the surface with a scanning laser beam, or by cold flowing the solid material M into the concavities with even pressure against a flat plate. In either case, the deposited material M on the field will be diminished as shown in FIG. 11. Furthermore, material M can be selectively etched from the field, e.g., by lithographic techniques, so that material M remains only in and adjacent to concavities. Upon melting, the material M then tends to remain in the concavities.

Figure 12:
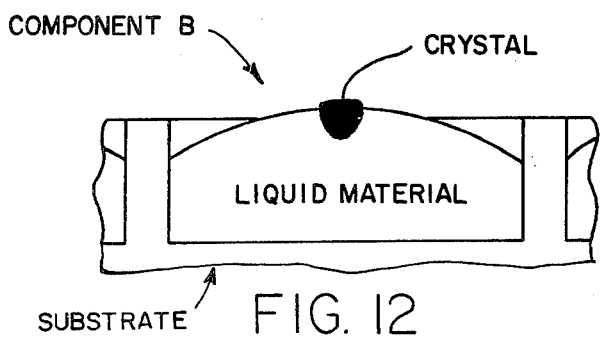
FIG. 12 illustrates the growth of a crystal in a concavity filled with material to which another component B is added.

If a subtractive solution growth method is not chosen for the crystallization process, and crystal growth is not to be by simply cooling the liquid material, it is possible to effect crystal growth by an additive solution growth method while the substrate is heated at or above the melting temperature of the unenriched material. The addition of a second component B will raise the level of the meniscus in the concavities toward the upper reaches of the side walls as shown in FIG. 12, and begin crystal growth as the second component continues to be added.

Regardless of the crystal growth method used, once growth of a crystal begins, the crystal will float because the density of the growing semiconductor crystal is almost always less than that of the saturated liquid material from which it is growing. There are some exceptions to the rule, i.e., AlSb ($\rho \approx 4.26$) growing from Al-rich solution ($\rho_{Al} \approx 2.4$), but these are of a minor practical interest. The floating crystal will center itself in the concavity as shown in FIG. 12 because that is the highest point of the meniscus. Uniform orientation of the crystal growth may be achieved by the application of some external force, such as a magnetic or electrostatic field. As the crystal continues to grow, it will reach the bottom and the side walls, and virtually all of the material will be used in the process. Because an inert substrate is being used, nucleation of crystals on the bottom or side walls of the concavity will not occur. However, as the crystal grows to the bottom and the side walls, it will attach itself sufficiently to remain firmly fixed in the concavity.

Having described the process in general with reference to FIG. 1, and the substrate to be used with reference to the remaining figures, examples of the techniques using the substrate in the context of the present invention will now be described.

A first example consists of liquid germanium vapor deposited on a heated quartz ($SiO_2$) substrate from $GeH_4$ in an RF heated cold-wall reactor. The concavities are first overfilled, and then the field is cleared by raising the temperature of the substrate and deposited germanium to a convenient evaporation temperature (about 1200° C.) in the presence of flowing hydrogen. As the material in the field evaporates, the material in the concavities will also be evaporated so that once the field is cleared, the concavities will no longer be overfilled. Then the substrate and germanium are slowly cooled in an atmosphere of hydrogen to crystallize the germanium. If any crystallized material remains in the field, it may be removed by chemical etching, in which case the single crystals in the concavities will be further reduced in size. Since chemical etching may cause defects on the surfaces of the crystals, it may be necessary to recrystallize by isothermal heating and cooling. By cooling slowly, growth of a single crystal in each concavity is virtually assured. As noted hereinbefore, the growing crystal floats to the surface of the liquid material and centers itself in the concavity at the high point in the meniscus.

Germanium has a very large contact angle $\theta$ near 150°, against $SiO_2$ or graphite, which makes it difficult to work with the pure (unalloyed) element in the context of this invention, though not impossible. Consequently, it may be desirable to use some other elemental (pure) semiconductor material to practice the invention, such as tellurium which has a contact angle $\theta$ of approximately 90° against $SiO_2$.

Compound semiconductors, which are more common than elemental ones, are convenient to use in the context of this invention because they lend themselves to solution growth methods of both the additive and subtractive type.

An example of an additive solution growth process for indium antimonide (InSb) begins with liquid indium (above 150° C.) deposited on the substrate to at least partially fill the concavities. Then the field is cleared of liquid globules of indium by evaporation at 700° C., thus partially depleting the globules in the concavities. Then antimony vapor from indium antimonide positioned upstream adds the second component to the compound semiconductor InSb, thereby increasing the size of the globules in the concavities. As the liquid in the concavities becomes richer in antimony, a single crystal will begin to grow in the concavities.

An example of a subtractive method for indium antimonide (InSb) begins by deposition of antimony onto a substrate heated at 650° C., which is about 20° above the melting point of Sb. Deposition continues until the concavities are filled with liquid Sb. Then deposition is stopped. Now the heated substrate loses Sb by evaporation which is allowed to continue until the field is cleared. Then triethyl indium is flowed past the heated substrate, feeding indium into the liquid of the concavities until the composition reaches approximately 32 atomic percent indium, which is an eutectic composition in this system. At that time temperature is lowered to approximately 505° C., which is slightly above the eutectic temperature. The substrate is allowed to remain at this temperature, slowly losing antimony by evaporation, thus causing an InSb crystal to grow in each concavity from the solution. This process is allowed to continue until only an InSb crystal remains in a typical concavity, whereupon the substrate is brought back to room temperature. Note that the meniscus of the liquid in each of the concavities will drop during the evaporation period as the field is cleared, and then rises again as indium is fed into the liquid antimony. Then the meniscus will drop again during the process of losing antimony by evaporation. However, if the concavities are initially overfilled with antimony, relying on the pinning points to hold the liquid in the concavities, the meniscus may be allowed to drop, rise and drop again, possibly without the meniscus ever leaving the pinning points.

An example of a solid material deposited on the substrate, rather than a liquid starts with depositing a film of indium on the substrate at room temperature (below 156° C. the melting point of indium). The material in the field is then caused to cold flow into the concavities by pressure applied with a flat plate. Any remaining on the field may then be cleared by etching. Thereafter, the substrate is placed in a furnace at a high temperature (500° C.) to melt the indium. The furnace is filled with hydrogen to reduce any oxides of indium in the melting process. Finally the liquid indium is allowed to cool slowly, thereby growing single crystals of indium in the concavities. If a compound semiconductor crystal is desired, such as InSb or InP, the indium crystals may be remelted in a furnace tube and the second component added as before.

Still another technique is to deposit a solid film of indium onto a substrate at room temperature followed by heating above the melting point of indium and cooling the substrate. This procedure is repeated several times in order for the material to at least partially fill the concavities. Any material remaining on the field is then removed by etching in diluted hydrochloric acid. Following that, the substrate is heated at 700° C. for two hours in forming gas (13% $H_2$ in He) to deoxidize the indium and allow it to form a meniscus (equilibrium shape) in each concavity. A second component for a compound semiconductor may then be added as before.

Although particular embodiments of the invention have been described and illustrated herein, it is recognized that variations and equivalents may readily occur to those skilled in the art. Consequently, it is intended that the claims be interpreted to cover such variations and equivalents.

What is claimed is:

1. A method for in situ growth of an array of single crystals from nonwetting material deposited on an inert substrate comprising the steps of
   preparing a surface of said substrate with an array of concavities which, will the substrate uniformly heated, stably contain liquid material at the substrate temperature by the combined effects of surface tension and geometry, said array of concavities having a field between every pair of concavities having a width that is small relative to the smallest dimension of the concavities, said array having a geometry that maximizes the total concavity area, which is large relative to the total field area,
   depositing said material from which said crystals are to be grown on said prepared surface of said substrate to at least partially fill said concavities,
   chemically removing deposited material from said field without a mask, and
   crystallizing a single crystal from said material in each concavity with the substrate uniformly heated and said material at the same temperature.

2. A method as defined in claim 1 wherein crystallization is effected by isothermally heating said substrate at a liquid temperature of said deposited material and changing the composition of said deposited material.

3. A method as defined in claim 1 or 2, wherein said material is deposited on said substrate while said substrate is heated at a liquid temperature of said material.

4. A method as defined in claim 3, wherein said deposited material is removed from said field during the process of crystallizing said material.

5. A method as defined in claim 1 wherein said concavities are densely packed polygons.

6. A method as defined in claim 5 wherein said polygons are selected from a group of geometric configurations consisting of triangles, parallelograms and hexagons.

7. A method as defined in claim 1 wherein said material is deposited as a solid followed by heating above the melting point of said material and cooling below said melting point, and repeating the depositing, heating and cooling procedure a plurality of times to at least partially fill said concavities before chemically removing material deposited on the field of said substrate between concavities.

8. A method as defined in claim 1 wherein said concavities are densely packed irregular hexagons having alternate sides uniformly shorter than the remaining sides of uniform length.

9. A method as defined in claim 1 wherein said concavities are densely packed irregular hexagons having two opposite sides uniformly longer than the remaining sides of uniform length.

10. A method as defined in claim 1 wherein said concavities are densely packed regular hexagons having alternate sides with inclined upper edges, and the remaining sides undercut to leave an overhanging ledge.

11. A method as defined in claim 1 wherein said concavities are densely packed rectangles.

12. A method as defined in claim 11 wherein said rectangular concavities are square.

* * * * *

UNITED STATES PATENT AND TRADEMARK OFFICE
CERTIFICATE OF CORRECTION

PATENT NO. : 4,479,847
DATED : October 30, 1984
INVENTOR(S) : James O. McCaldin & Thomas F. Kuech It is certified that error appears in the above-identified patent and that said Letters Patent are hereby corrected as shown below:

In the Abstract, line 10, after "evaporation" insert -- or --

Column 10, line 31, delete "will" and substitute -- with --.

Signed and Sealed this

Ninth Day of April 1985

[SEAL]

Attest:

DONALD J. QUIGG

Attesting Officer     Acting Commissioner of Patents and Trademarks